(12) United States Patent
Manjunath

(10) Patent No.: US 12,254,955 B2
(45) Date of Patent: Mar. 18, 2025

(54) HIGH-SPEED MULTIPLEXER FOR REDUCING GLITCH POWER

(71) Applicant: Meta Platforms Technologies, LLC, Menlo Park, CA (US)

(72) Inventor: Sri Harsha Manjunath, Folsom, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 101 days.

(21) Appl. No.: 18/173,572

(22) Filed: Feb. 23, 2023

(65) Prior Publication Data
US 2024/0290362 A1    Aug. 29, 2024

(51) Int. Cl.
*G11C 7/10* (2006.01)
*G11C 7/22* (2006.01)
*H03L 7/099* (2006.01)

(52) U.S. Cl.
CPC ............ *G11C 7/1066* (2013.01); *G11C 7/222* (2013.01); *H03L 7/0995* (2013.01); *G11C 2207/2254* (2013.01)

(58) Field of Classification Search
CPC .................. G11C 7/1066; G11C 7/222; G11C 2207/2254; H03L 7/0995
USPC ...................................................... 365/233.1
See application file for complete search history.

(56) References Cited

U.S. PATENT DOCUMENTS

| | | | |
|---|---|---|---|
| 2010/0091537 A1 | 4/2010 | Best et al. | |
| 2014/0177377 A1* | 6/2014 | Kumar | G11C 29/023 365/233.12 |
| 2014/0293710 A1* | 10/2014 | Ware | G11C 29/022 365/194 |
| 2017/0054549 A1* | 2/2017 | Stott | G11C 7/1051 |
| 2018/0267810 A1 | 9/2018 | Madpur et al. | |
| 2021/0065753 A1 | 3/2021 | Lee et al. | |
| 2024/0063809 A1 | 2/2024 | Mulder et al. | |
| 2024/0288494 A1* | 8/2024 | Manjunath | G01R 31/31725 |
| 2024/0288831 A1* | 8/2024 | Manjunath | G01R 31/31725 |

* cited by examiner

*Primary Examiner* — Ly D Pham
(74) *Attorney, Agent, or Firm* — Greenberg Traurig, LLP

(57) ABSTRACT

A method implemented by a multi-chip package (MCP) electronic device including a die-to-die (D2D) interface is provided. The method includes receiving, by a receiver portion of a first die of the D2D interface, and from a transmitter portion of a second die of the D2D interface, a first timing signal and a second timing signal. The method includes generating a timing calibration signal based on a timing value corresponding to a midpoint of an estimated margin between overlaying segments of the first timing signal and a timing value corresponding to a delay of a unit delay associated with the receiver portion. The method includes generating an output timing signal based on the timing calibration signal, and selecting a timing delay signal based on the output timing signal and the timing calibration signal. The timing delay signal is selected to reduce a potential glitch power associated with the receiver portion.

20 Claims, 13 Drawing Sheets

HIGH-SPEED MULTIPLEXER FOR REDUCING GLITCH POWER

TECHNICAL FIELD

This disclosure generally relates to die-to-die (D2D) interfaces, and, more specifically, to a high-speed multiplexer for reducing glitch power for D2D interfaces.

BACKGROUND

Traditionally, chip designers moved to smaller process nodes to achieve desired power and performance goals, functionality, form factor, and cost. With an increasing need for processing power, current multi-die chip designs, system-on-chips (SoCs), or other similar multi-chip package (MCP) devices are becoming much larger than what may be fabricated with reasonable yield. Multi-die chip designs have further reached a development stage in which moving to an advanced node is impracticable. Today, chip designers are splitting multi-die chip designs into an increasing number of smaller dies, which are easier to fabricate and produce better yields. Specifically, multi-die chip designs may include a large design partitioned into multiple smaller dies, which may be referred to as chiplets or tiles. The multiple dies may be then integrated in a single package to achieve the expected power and form factor goals.

Indeed, while monolithic chip designs include all of their functionality onto a single silicon chip, for example, multi-die designs provide the product modularity and flexibility to mix and match separate dies into packages. For example, in some instances, a processor for a compute function may be on an advanced node while the input-output (I/O) function may on a lesser advanced older node to maximize device optimization. In other instances, a number of dies, for example, may be placed side-by-side (e.g., 2D package) and connected by dedicated die-to-die (D2D) interfaces. To further increase density, a number of dies may be assembled into a 2.5D package or 3D package. Lastly, the connections between the number of dies on a package may include constraints of being power efficient, having low latency, having high bandwidth to transfer large amounts of data between dies, and deliver error-free transmissions. It may be thus useful to provide techniques to improve multi-die chip designs and D2D interfaces.

SUMMARY OF CERTAIN EMBODIMENTS

The present embodiments are directed to techniques for providing accurate clock calibration for a multi-chip package (MCP) electronic device including a die-to-die (D2D) interface. In certain embodiments, the electronic device may receive, by a receiver portion of a first die of the D2D interface, and from a transmitter portion of a second die of the D2D interface, a first timing signal and a second timing signal. For example, in one embodiment, the first timing signal may include a data signal and the second timing signal may include a clock signal. In certain embodiments, the electronic device may then perform a first calibration of one or more of the first timing signal or the second timing signal. In one embodiment, the first calibration may be configured to align a first rising edge of the first timing signal with a second rising edge of the second timing signal. For example, in some embodiments, the electronic device may perform the first calibration of one or more of the first timing signal or the second timing signal by performing a calibration of only the second timing signal. In some embodiments, the first calibration may be configured to align the first rising edge of the first timing signal with the second rising edge of the second timing signal by offsetting the second rising edge with respect to the first rising edge by a timing error greater than approximately zero.

In certain embodiments, the electronic device may then perform a second calibration of the second timing signal. In one embodiment, the second calibration may be configured to offset the second rising edge of the second timing signal with respect to the first rising edge of the first timing signal by a predetermined time period. In certain embodiments, the electronic device may perform the second calibration of the second timing signal by offsetting the second rising edge of the second timing signal to correspond to a midpoint of a pulse width of the first timing signal. For example, the second calibration may be configured to offset the second rising edge of the second timing signal with respect to the first rising edge of the first timing signal by a timing error of approximately one-half a pulse width of the first timing signal. In certain embodiments, the electronic device may perform the second calibration of the second timing signal by reducing a bit error rate (BER) between the receiver portion of the first die and the transmitter portion of the second die.

The present embodiments further provide techniques for providing accurate clock calibration for a multi-chip package (MCP) electronic device over process, voltage, temperature (PVT) corners. In certain embodiments, the electronic device may receive, by a receiver portion of a first die of the D2D interface, and from a transmitter portion of a second die of the D2D interface, a first timing signal and a second timing signal. For example, in one embodiment, the first timing signal may include a data signal and the second timing signal may include a clock signal. In certain embodiments, the electronic device may perform at least one calibration of the second timing signal by generating a timing calibration signal based on a timing value corresponding to a midpoint of an estimated margin between overlaying segments of the first timing signal and a timing value corresponding to a delay of a unit delay of an oscillator associated with the receiver portion. In some embodiments, the timing value corresponding to the midpoint of the estimated margin may include a timing value corresponding to a midpoint of an eye margin of a data signal supplied from the transmitter portion of the second die to the receiver portion of the first die. In one embodiment, the timing value corresponding to the midpoint of the eye margin of the data signal may include a sampling period of the data signal. In one embodiment, the sampling period of the data signal may include approximately one-half of a unit interval corresponding to the eye margin of the data signal.

In certain embodiments, the timing value corresponding to the delay of the unit delay of the oscillator may include a timing value corresponding to a delay of a unit delay buffer of a ring oscillator of the receiver portion. For example, in one embodiment, the timing value corresponding to the delay of the unit delay of the oscillator may include a timing value corresponding to a delay of a unit delay buffer of a ring oscillator of the receiver portion. In certain embodiments, the electronic device may then output the timing calibration signal. In certain embodiments, the timing calibration signal may be configured to cause a rising edge of the second timing signal to correspond substantially to a midpoint of a pulse width of the first timing signal.

The present embodiments further include techniques for providing a multi-chip package (MCP) electronic device including a die-to-die (D2D) interface and a high-speed multiplexer for reducing glitch power for the D2D interface. In certain embodiments, the electronic device may receive, by a receiver portion of a first die of the D2D interface, and from a transmitter portion of a second die of the D2D interface, a first timing signal and a second timing signal. For example, in one embodiment, the first timing signal may include a data signal and the second timing signal may include a clock signal. In certain embodiments, the electronic device may then generate a timing calibration signal based on a timing value corresponding substantially to a midpoint of an estimated margin between overlaying segments of the first timing signal and a timing value corresponding to a delay of a unit delay associated with the receiver portion.

In some embodiments, the timing value corresponding to the midpoint of the estimated margin may include a timing value corresponding to a midpoint of an eye margin of a data signal supplied from the transmitter portion of the second die to the receiver portion of the first die. In some embodiments, the timing value corresponding to the delay of the unit delay of the oscillator comprises a timing value corresponding to a delay of a unit delay buffer of a ring oscillator of the receiver portion. In certain embodiments, the electronic device may then generate an output timing signal based on the timing calibration signal and select a timing delay signal based on the output timing signal and the timing calibration signal. For example, in some embodiments, the timing delay signal may be selected to reduce a potential glitch power associated with the receiver portion. In certain embodiments, the electronic device may select the timing delay signal may by selecting at least one of a plurality of timing delay signals based on the output timing signal and the timing calibration signal. In certain embodiments, selecting the timing delay signal may further include receiving a feedback clock signal corresponding to the output timing signal, selecting a timing delay signal based on the feedback clock signal, and adjusting the output timing signal based on the selected timing delay signal. In one embodiment, the timing delay signal may be generated by a high-speed multiplexer configured to reduce the potential glitch power associated with the receiver portion.

The embodiments disclosed herein are only examples, and the scope of this disclosure is not limited to them. Certain embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

DESCRIPTION OF EXAMPLE EMBODIMENTS

Figure 1A:
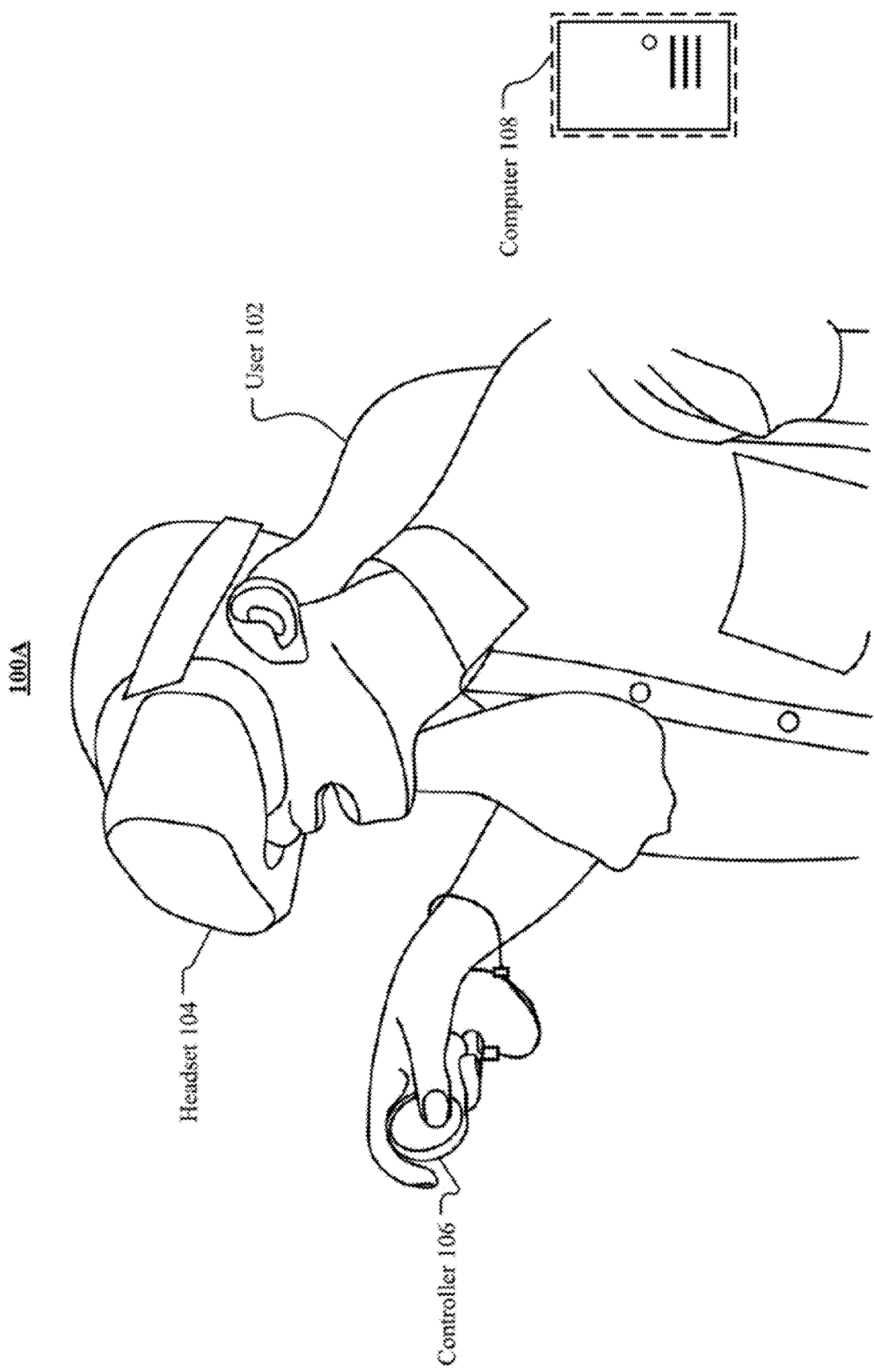
FIG. 1A illustrates an example artificial reality system.

Traditionally, chip designers moved to smaller process nodes to achieve desired power and performance goals, functionality, form factor, and cost. With an increasing need for processing power, current multi-die chip designs, system-on-chips (SoCs), or other similar multi-chip package (MCP) devices are becoming much larger than what may be fabricated with reasonable yield. Multi-die chip designs have further reached a development stage in which moving to an advanced node is impracticable. Today, chip designers are splitting multi-die chip designs into an increasing number of smaller dies, which are easier to fabricate and produce better yields. Specifically, multi-die chip designs may include a large design partitioned into multiple smaller dies, which may be referred to as chiplets or tiles. The multiple dies may be then integrated in a single package to achieve the expected power and form factor goals.

Indeed, while monolithic chip designs include all of their functionality onto a single silicon chip, for example, multi-die designs provide the product modularity and flexibility to mix and match separate dies into packages. For example, in some instances, a processor for a compute function may be on an advanced node while the input-output (I/O) function may on a lesser advanced older node to maximize device optimization. In other instances, a number of dies, for example, may be placed side-by-side (e.g., 2D package) and connected by dedicated die-to-die (D2D) interfaces. To further increase density, a number of dies may be assembled into a 2.5D package or 3D package. Lastly, the connections between the number of dies on a package may include constraints of being power efficient, having low latency, having high bandwidth to transfer large amounts of data between dies, and deliver error-free transmissions. It may be thus useful to provide techniques to improve multi-die chip designs and D2D interfaces.

Indeed, the present embodiments are directed to techniques for providing accurate clock calibration for a multi-chip package (MCP) electronic device including a die-to-die (D2D) interface. In certain embodiments, the electronic device may receive, by a receiver portion of a first die of the D2D interface, and from a transmitter portion of a second die of the D2D interface, a first timing signal and a second timing signal. For example, in one embodiment, the first timing signal may include a data signal and the second timing signal may include a clock signal. In certain embodiments, the electronic device may then perform a first calibration of one or more of the first timing signal or the second timing signal. In one embodiment, the first calibration may be configured to align a first rising edge of the first timing signal with a second rising edge of the second timing signal. For example, in some embodiments, the electronic device may perform the first calibration of one or more of the first timing signal or the second timing signal by performing a calibration of only the second timing signal. In some embodiments, the first calibration may be configured to align the first rising edge of the first timing signal with the second rising edge of the second timing signal by offsetting the second rising edge with respect to the first rising edge by a timing error greater than approximately zero.

In certain embodiments, the electronic device may then perform a second calibration of the second timing signal. In one embodiment, the second calibration may be configured to offset the second rising edge of the second timing signal with respect to the first rising edge of the first timing signal by a predetermined time period. In certain embodiments, the electronic device may perform the second calibration of the second timing signal by offsetting the second rising edge of the second timing signal to correspond to a midpoint of a pulse width of the first timing signal. For example, the second calibration may be configured to offset the second rising edge of the second timing signal with respect to the first rising edge of the first timing signal by a timing error of approximately one-half a pulse width of the first timing signal. In certain embodiments, the electronic device may perform the second calibration of the second timing signal by reducing a bit error rate (BER) between the receiver portion of the first die and the transmitter portion of the second die.

The present embodiments further provide techniques for providing accurate clock calibration for a multi-chip package (MCP) electronic device over process, voltage, temperature (PVT) corners. In certain embodiments, the electronic device may receive, by a receiver portion of a first die of the D2D interface, and from a transmitter portion of a second die of the D2D interface, a first timing signal and a second timing signal. For example, in one embodiment, the first timing signal may include a data signal and the second timing signal may include a clock signal. In certain embodiments, the electronic device may perform at least one calibration of the second timing signal by generating a timing calibration signal based on a timing value corresponding to a midpoint of an estimated margin between overlaying segments of the first timing signal and a timing value corresponding to a delay of a unit delay of an oscillator associated with the receiver portion. In some embodiments, the timing value corresponding to the midpoint of the estimated margin may include a timing value corresponding to a midpoint of an eye margin of a data signal supplied from the transmitter portion of the second die to the receiver portion of the first die. In one embodiment, the timing value corresponding to the midpoint of the eye margin of the data signal may include a sampling period of the data signal. In one embodiment, the sampling period of the data signal may include approximately one-half of a unit interval corresponding to the eye margin of the data signal.

In certain embodiments, the timing value corresponding to the delay of the unit delay of the oscillator may include a timing value corresponding to a delay of a unit delay buffer of a ring oscillator of the receiver portion. For example, in one embodiment, the timing value corresponding to the delay of the unit delay of the oscillator may include a timing value corresponding to a delay of a unit delay buffer of a ring oscillator of the receiver portion. In certain embodiments, the electronic device may then output the timing calibration signal. In certain embodiments, the timing calibration signal may be configured to cause a rising edge of the second timing signal to correspond substantially to a midpoint of a pulse width of the first timing signal.

The present embodiments further include techniques for providing a multi-chip package (MCP) electronic device including a die-to-die (D2D) interface and a high-speed multiplexer for reducing glitch power for the D2D interface. In certain embodiments, the electronic device may receive, by a receiver portion of a first die of the D2D interface, and from a transmitter portion of a second die of the D2D interface, a first timing signal and a second timing signal. For example, in one embodiment, the first timing signal may include a data signal and the second timing signal may include a clock signal. In certain embodiments, the electronic device may then generate a timing calibration signal based on a timing value corresponding substantially to a midpoint of an estimated margin between overlaying segments of the first timing signal and a timing value corresponding to a delay of a unit delay associated with the receiver portion.

In some embodiments, the timing value corresponding to the midpoint of the estimated margin may include a timing value corresponding to a midpoint of an eye margin of a data signal supplied from the transmitter portion of the second die to the receiver portion of the first die. In some embodiments, the timing value corresponding to the delay of the unit delay of the oscillator comprises a timing value corresponding to a delay of a unit delay buffer of a ring oscillator of the receiver portion. In certain embodiments, the electronic device may then generate an output timing signal based on the timing calibration signal and select a timing delay signal based on the output timing signal and the timing calibration signal. For example, in some embodiments, the timing delay signal may be selected to reduce a potential glitch power associated with the receiver portion. In certain embodiments, the electronic device may select the timing delay signal may by selecting at least one of a plurality of timing delay signals based on the output timing signal and the timing calibration signal. In certain embodiments, selecting the timing delay signal may further include receiving a feedback clock signal corresponding to the output timing signal, selecting a timing delay signal based on the feedback clock signal, and adjusting the output timing signal based on the selected timing delay signal. In one embodiment, the timing delay signal may be generated by a high-speed multiplexer configured to reduce the potential glitch power associated with the receiver portion.

FIG. 1A illustrates an example artificial reality system 100A. In certain embodiments, the artificial reality system 100A may comprise a headset 104, a controller 106, and a computing system 108. A user 102 may wear the headset 104 that may display visual artificial reality content to the user 102. The headset 104 may include an audio device that may provide audio artificial reality content to the user 102. The headset 104 may include one or more cameras which can capture images and videos of environments. The headset 104 may include an eye tracking system to determine the vergence distance of the user 102. The headset 104 may be referred as a head-mounted display (HDM). The controller 106 may comprise a trackpad and one or more buttons. The controller 106 may receive inputs from the user 102 and relay the inputs to the computing system 108. The controller 206 may also provide haptic feedback to the user 102. The computing system 108 may be connected to the headset 104 and the controller 106 through cables or wireless connections. The computing system 108 may control the headset 104 and the controller 106 to provide the artificial reality content to and receive inputs from the user 102. The computing system 108 may be a standalone host computer system, an on-board computer system integrated with the headset 104, a mobile device, or any other hardware platform capable of providing artificial reality content to and receiving inputs from the user 102.

Figure 1B:
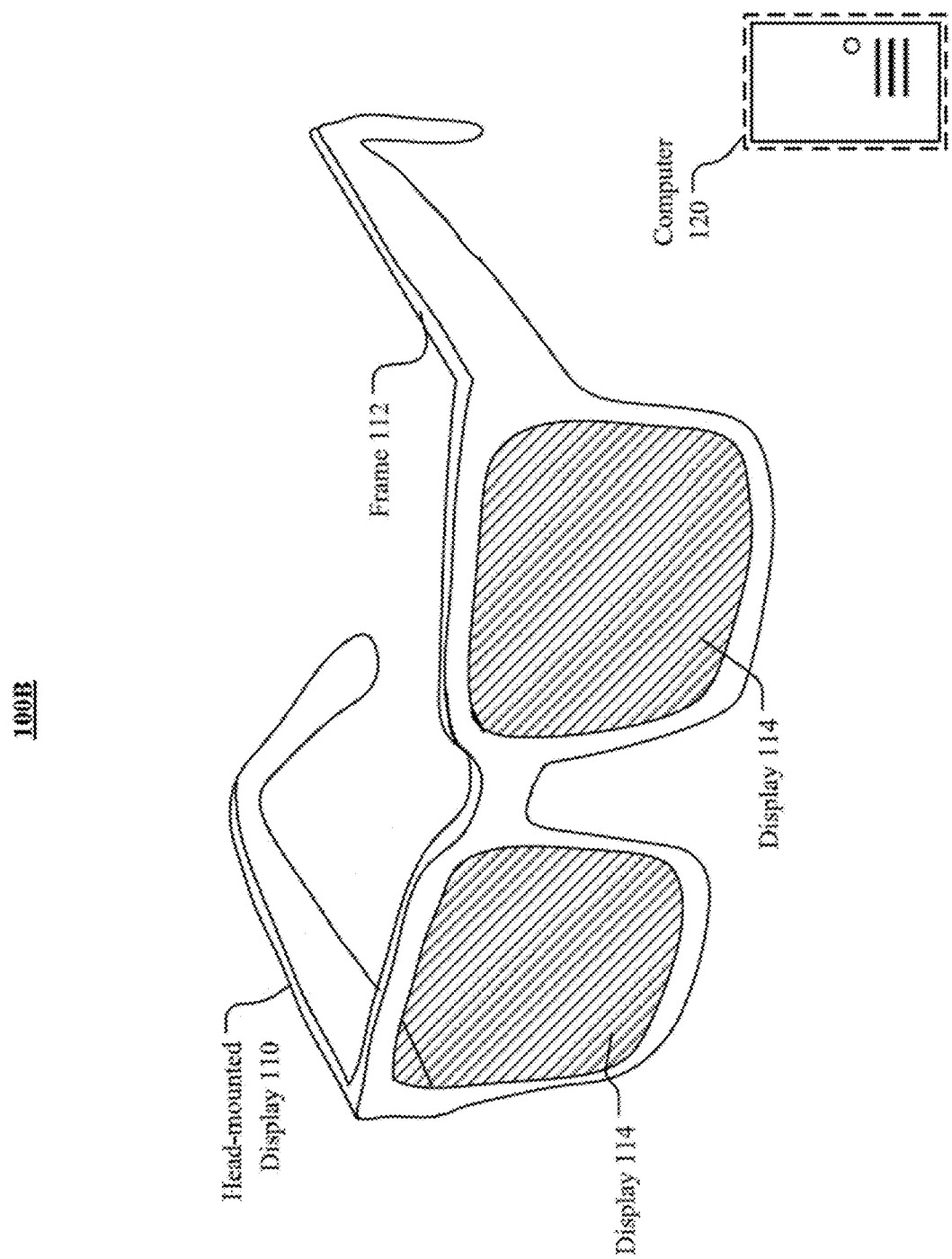
FIG. 1B illustrates an example augmented reality system.

FIG. 1B illustrates an example augmented reality system 100B. The augmented reality system 100B may include a head-mounted display (HMD) 110 (e.g., glasses) comprising a frame 112, one or more displays 114, and a computing system 120. The displays 114 may be transparent or translucent allowing a user wearing the HMD 110 to look through the displays 114 to see the real world and displaying visual artificial reality content to the user at the same time. The HMD 110 may include an audio device that may provide audio artificial reality content to users. The HMD 110 may include one or more cameras which can capture images and videos of environments. The HMD 110 may include an eye tracking system to track the vergence movement of the user wearing the HMD 110. The augmented reality system 100B may further include a controller comprising a trackpad and one or more buttons. The controller may receive inputs from users and relay the inputs to the computing system 120. The controller may also provide haptic feedback to users. The computing system 120 may be connected to the HMD 110 and the controller through cables or wireless connections. The computing system 120 may control the HMD 110 and the controller to provide the augmented reality content to and receive inputs from users. The computing system 120 may be a standalone host computer system, an on-board computer system integrated with the HMD 110, a mobile device, or any other hardware platform capable of providing artificial reality content to and receiving inputs from users.

Figure 2:
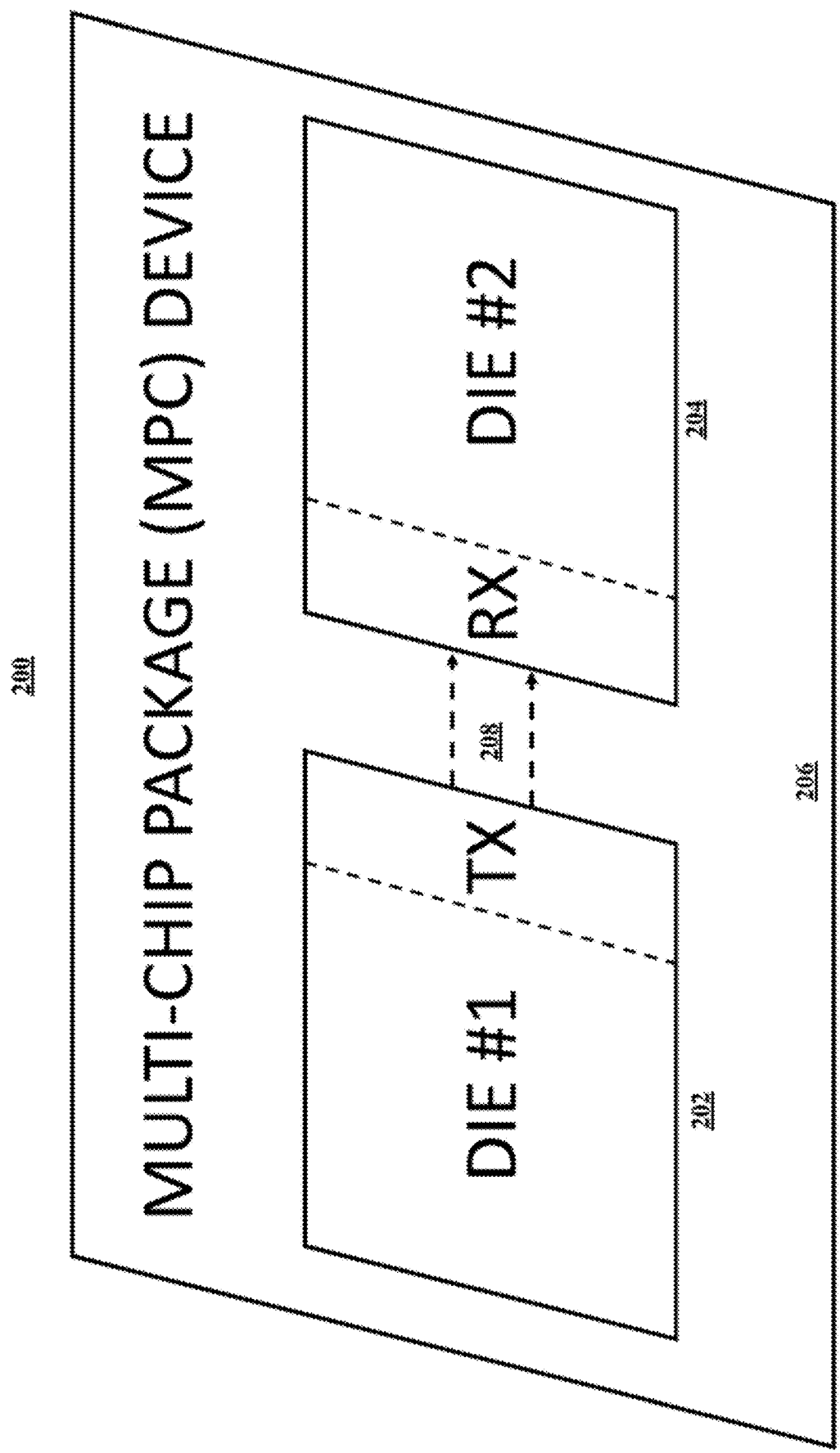
FIG. 2 illustrates a multi-chip package (MCP) electronic device.

FIG. 2 illustrates a multi-chip package (MCP) electronic device 200 that may be useful in performing forgoing techniques as discussed herein, in accordance with the presently disclosed embodiments. In certain embodiments, the MCP electronic device 200 may include a first die 202 (e.g., "Die #1") and a second die 204 (e.g., "Die #2") disposed onto a single package 206 (e.g., interposer). In one embodiment, the MCP electronic device 200 may include a system-on-chip (SoC) electronic device and include any number of dies 202, 204 or other functional blocks (e.g., chiplets) assembled into 2-dimensional (2D) package, a 2.5D package, or a 3D package. In certain embodiments, as further depicted by FIG. 2, the MCP electronic device 200 may also include one or more connections or channels 208 for transferring data, for example, in accordance with a clock forwarding functionality from a transmitter "TX" of the first die 202 (e.g., "Die #1") to a receiver "RX" of the second die 204 (e.g., "Die #2"). In accordance with the presently disclosed embodiments, the one or more connections or channels 208 may be power efficient, have low latency, have high bandwidth for transferring large amounts of data between the first die 202 (e.g., "Die #1") and the second die 204 (e.g., "Die #2"), and deliver error-free data transfers (e.g., ultra-low bit error rate (BER)).

As will be further appreciated with respect to FIGS. 3, 4, 5, 6A, 6B, and 7-11, the MCP) electronic device 200 may be utilized for (1) providing accurate clock calibration for a multi-chip package (MCP) electronic device including a die-to-die (D2D) interface; (2) providing accurate clock calibration for an MCP electronic device over process, voltage, temperature (PVT) corners; and (3) providing an MCP electronic device including a D2D interface and a high-speed multiplexer for reducing glitch power for the D2D interface, among various other techniques in accordance with the presently disclosed embodiments.

Accurate Clock Calibration for Die-to-Die (D2D) Interfaces

Figure 3:
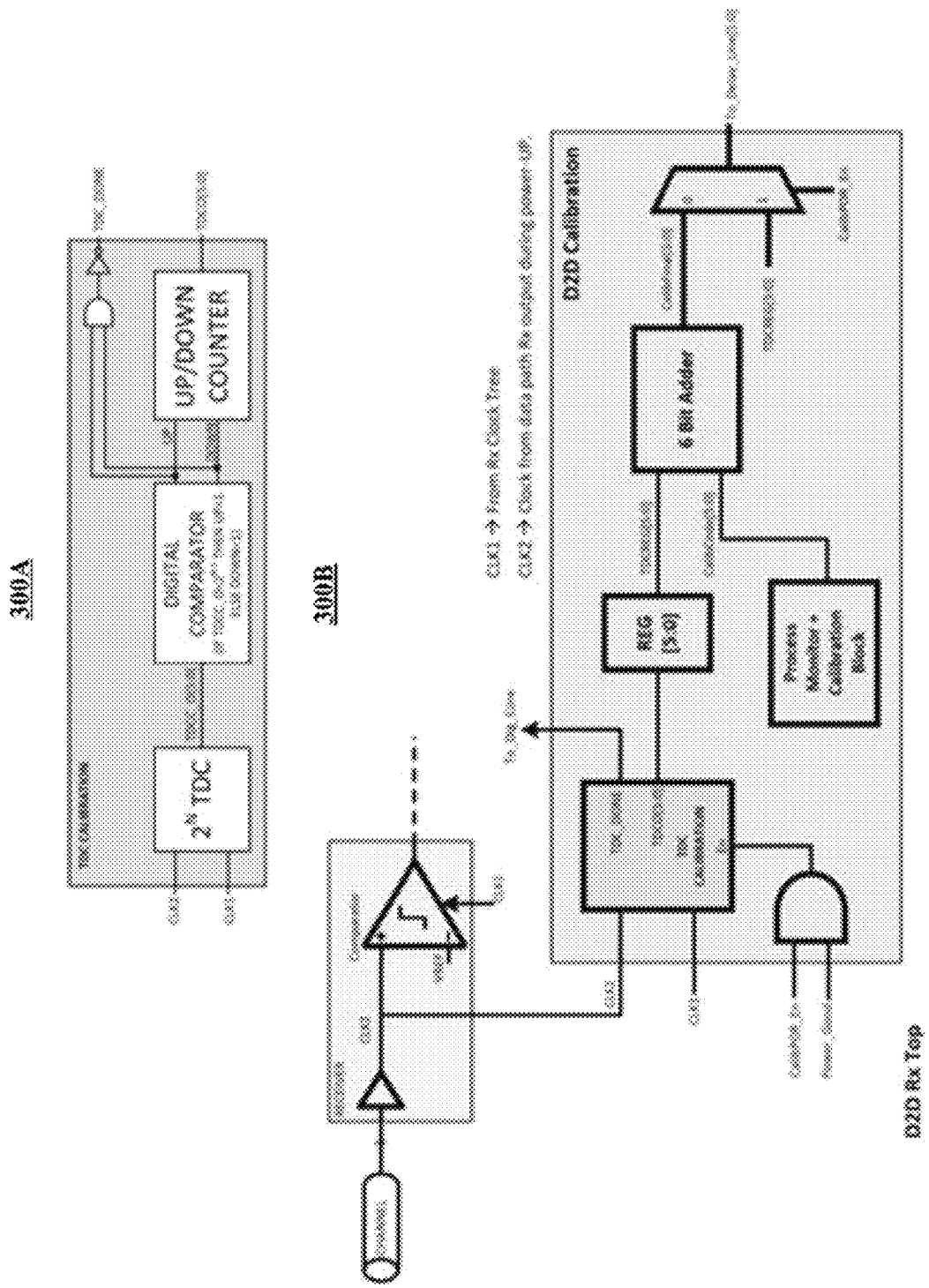
FIG. 3 illustrates one or more clock calibration architectures for providing accurate clock calibration for an MCP electronic device including a die-to-die (D2D) interface.

FIG. 3 illustrates one or more clock calibration architectures 300A, 300B for providing accurate clock calibration for an MCP electronic device including a D2D interface, in accordance with the presently disclosed embodiments. As depicted, the one or more clock calibration architectures 300A, 300B may include a time-to-digital converter (TDC) calibration architecture 300A and a D2D calibration architecture 300B. In certain embodiments, the TDC calibration architecture 300A and the D2D calibration architecture 300B may operate in conjunction in accordance with calibration timing diagrams 400 of FIG. 4 to provide accurate clock calibration for the MCP electronic device 200 including a D2D interface, in accordance with the presently disclosed embodiments.

Figure 4:
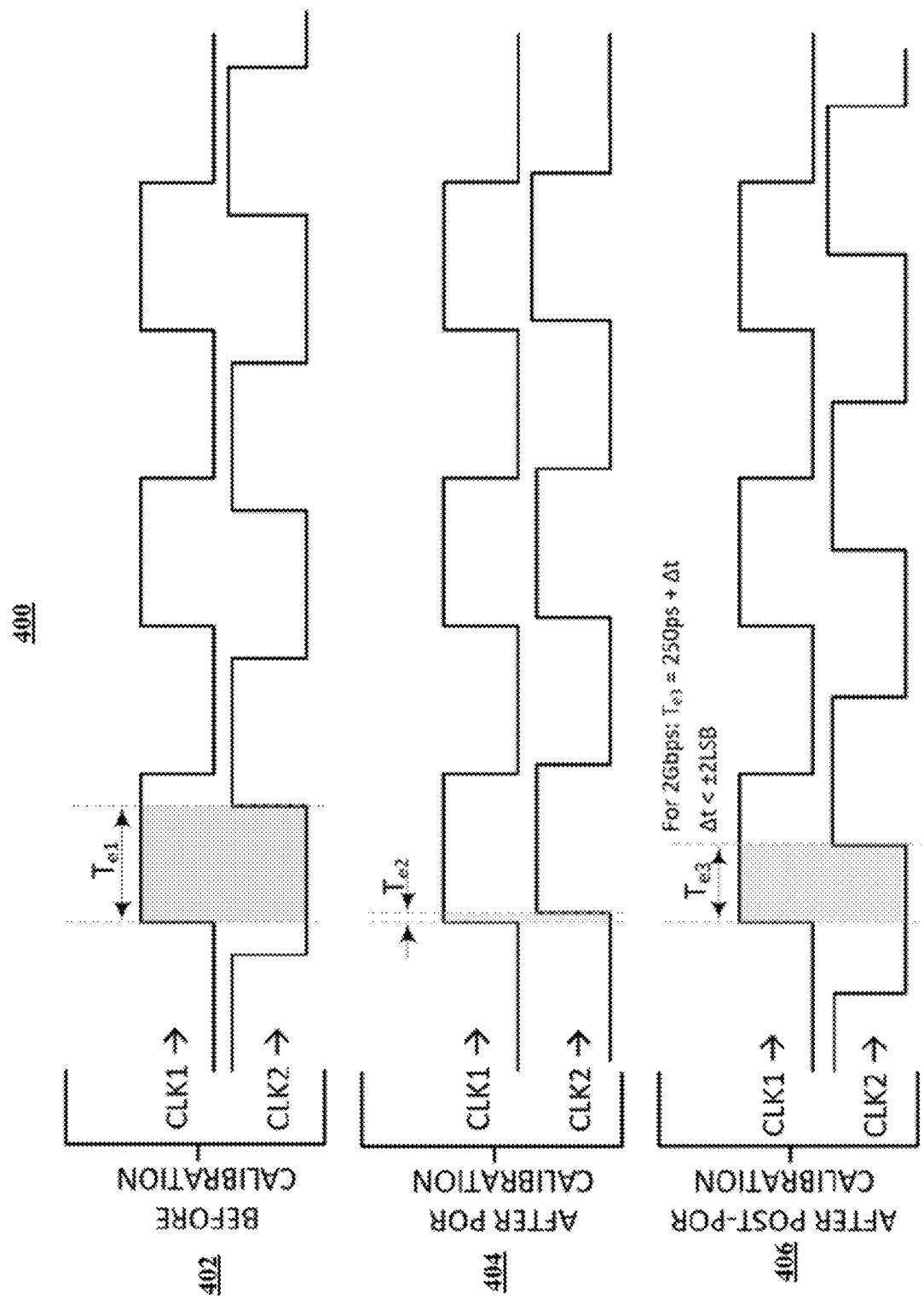
FIG. 4 illustrates timing diagrams for providing accurate clock calibration for an MCP electronic device including a D2D interface.

FIG. 4 illustrates timing diagrams 400 for providing accurate clock calibration for an MCP electronic device including a D2D interface, in accordance with the presently disclosed embodiments. As illustrated by the timing diagram 400A (e.g., "Before Calibration"), a first clock signal "CLK1" and a second clock signal "CLK2" including a timing error "Tc1." In certain embodiments, as illustrated by the timing diagram 400B (e.g., "After POR Calibration"), a first calibration of the first clock signal "CLK1" and/or the second clock signal "CLK2" may be performed to align or nearly align the rising edge of the first clock signal "CLK1" with the rising edge of the second clock signal "CLK2" as indicated by a timing error "Tc2" (e.g., timing error "Tc2"<timing error "Tc1"). In certain embodiments, as illustrated by the timing diagram 400C (e.g., "After Post-POR Calibration"), a second calibration of the second clock signal "CLK2" may be performed to offset the rising edge of the second clock signal "CLK2" with respect to the rising edge of the first clock signal "CLK1" by a predetermined time period as indicated by a timing error "Tc3." As illustrated, performing the second calibration of the second clock signal "CLK2" may include offsetting the rising edge of the second clock signal "CLK2" to substantially correspond to a midpoint of a pulse width of the first clock signal "CLK1."

Figure 5:
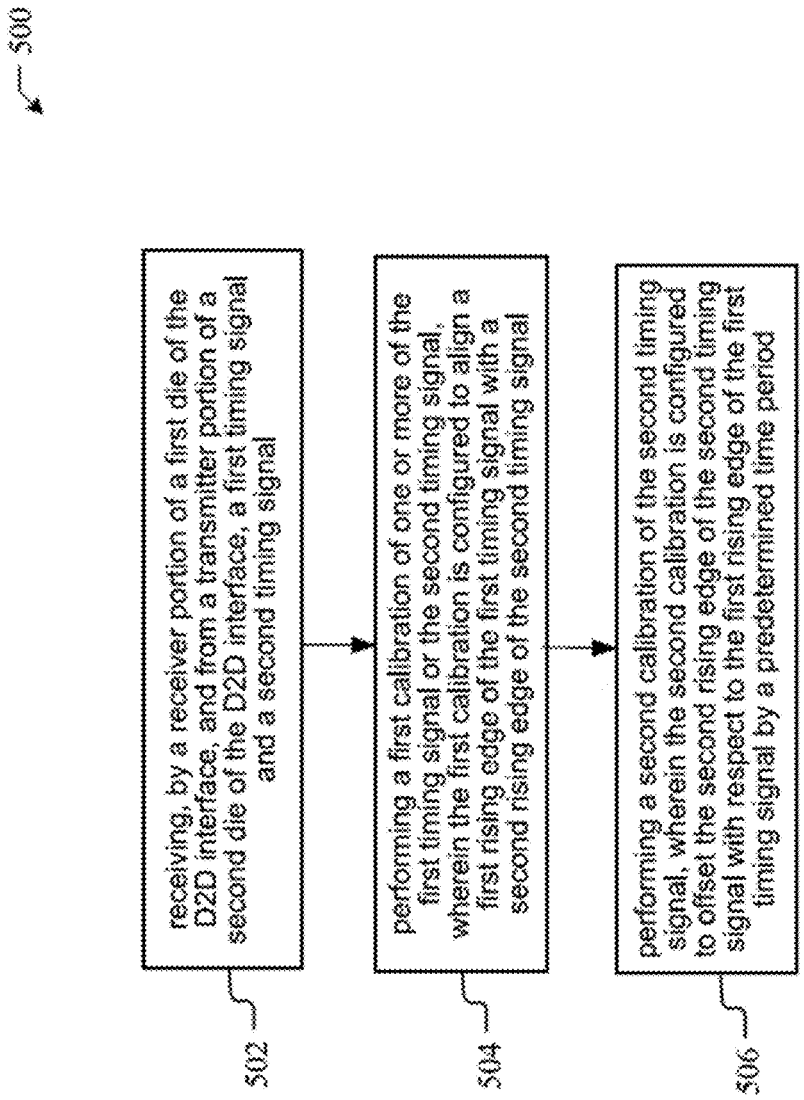
FIG. 5 is a flow diagram of a method for providing accurate clock calibration for an MCP electronic device including a D2D interface.

FIG. 5 illustrates is a flow diagram of a method 500 for providing accurate clock calibration for a multi-chip package (MCP) electronic device including a die-to-die (D2D) interface, in accordance with the presently disclosed embodiments. The method 500 may be performed utilizing one or more processors (e.g., MCP electronic device 200) that may include hardware (e.g., a general purpose processor, a graphic processing units (GPU), an application-specific integrated circuit (ASIC), a system-on-chip (SoC), a microcontroller, a field-programmable gate array (FPGA), or any other processing device(s) that may be suitable for processing image data), software (e.g., instructions running/executing on one or more processors), firmware (e.g., microcode), or any combination thereof.

The method 500 may begin at block 502 with one or more processors (e.g., MCP electronic device 200) receiving, by a receiver portion of a first die of the D2D interface, and from a transmitter portion of a second die of the D2D interface, a first timing signal and a second timing signal. For example, in one embodiment, the first timing signal may include a data signal and the second timing signal may include a clock signal. The method 500 may then continue at block 504 with the one or more processors (e.g., MCP electronic device 200) performing a first calibration of one or more of the first timing signal or the second timing signal, in which the first calibration is configured to align a first rising edge of the first timing signal with a second rising edge of the second timing signal. In one embodiment, the first calibration may be configured to align a first rising edge of the first timing signal with a second rising edge of the second timing signal. For example, in some embodiments, the first calibration may be configured to align the first rising edge of the first timing signal with the second rising edge of the second timing signal by offsetting the second rising edge with respect to the first rising edge by a timing error greater than approximately zero.

The method 500 may then continue at block 506 with the one or more processors (e.g., MCP electronic device 200) performing a second calibration of the second timing signal, in which the second calibration is configured to offset the second rising edge of the second timing signal with respect to the first rising edge of the first timing signal by a predetermined time period. For example, the second calibration of the second timing signal may be performed by offsetting the second rising edge of the second timing signal to correspond to a midpoint of a pulse width of the first timing signal. In one embodiment, the second calibration may be configured to offset the second rising edge of the second timing signal with respect to the first rising edge of the first timing signal by a timing error of approximately one-half a pulse width of the first timing signal.

Accurate Clock Calibration Over Process, Voltage, Temperature (PVT) Corners

Figure 6A:
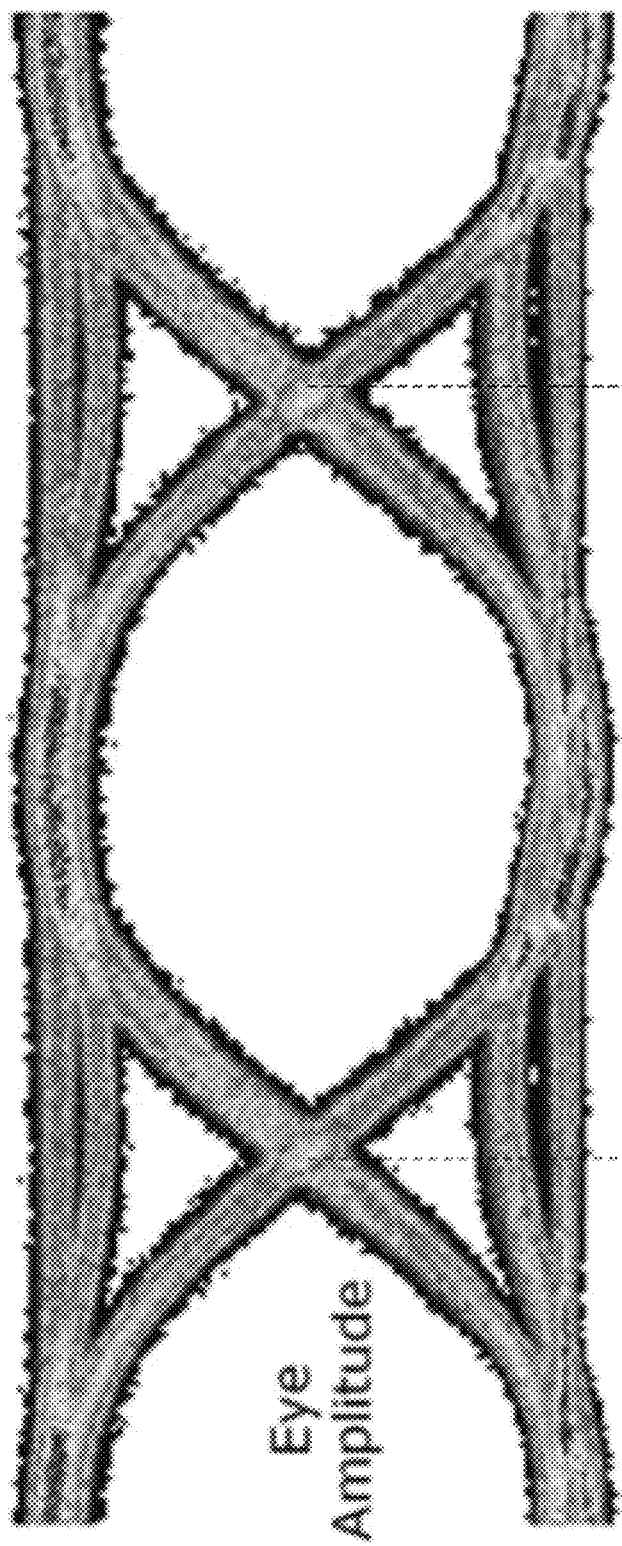
FIGS. 6A and 6B illustrate a waveform and a calibration architecture for providing accurate clock calibration for an MCP electronic device over process, voltage, temperature (PVT) corners.
Figure 6B:
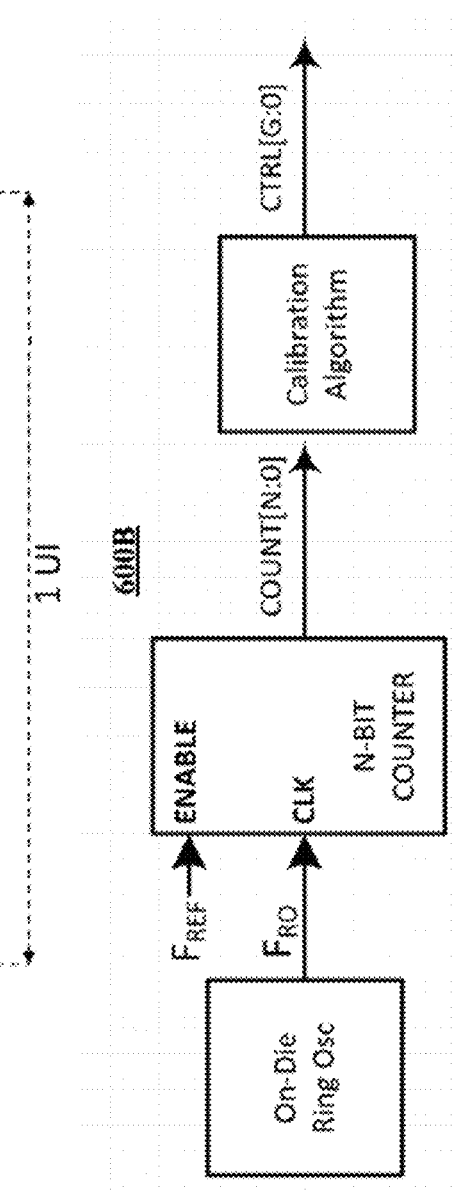

FIGS. 6A and 6B illustrate a waveform 600A and a calibration architecture 600B for providing accurate clock calibration for a multi-chip package (MCP) electronic device over process, voltage, temperature (PVT) corners, in accordance with the presently disclosed embodiments. In certain embodiments, the waveform 600A of FIG. 6A may include an eye margin waveform of a data signal supplied, for example, from the transmitter "TX" of the first die 202 (e.g., "Die #1") to the receiver "RX" of the second die 204 (e.g., "Die #2"). In certain embodiments, the calibration architecture 600B may operate to provide accurate clock calibration for the MCP electronic device 200 over PVT corners in accordance with the presently disclosed embodiments. In certain embodiments, the calibration architecture 600B may operate logically proceed in accordance with the following:

$F_{RO}=1/T_{RO}=1/(N*2*T_{DLY})$
N=Number of stages in Ring Oscillator
$T_{DLY}$=Delay of unit delay buffer in ring oscillator
$T_{REF}$=COUNT*$T_{RO}$=COUNT*N*2*$T_{DLY}$
Sampling Time=$T_{EYE}$=0.5*UI
UI=1/Data rate $$CTRL = \frac{TEYE}{TDLY} = \frac{TEYE * COUNT * N * 2}{TREF},$$

where $T_{REF}$ represents a measured reference clock period (e.g., from a crystal clock source), $T_{RO}$ represents an on-die ring oscillator clock period (e.g., $1/F_{RO}$), $T_{EYE}$ represents a midpoint of the eye margin waveform 600A where the data eye margin is sampled (e.g., 0.5*UI), and UI represents unit interval (=1/Data_rate).

In certain embodiments, as an analytical example of the foregoing:
Let Data Rate=2 Gbps→$T_{EYE}$≈250 ps≈256 ps=$2^8$ picoseconds (ps);
then FREF=15 MHz→$T_{REF}$=66666.66 ps≈65536 ps=$2^{16}$ ps;
N=64=$2^6$;
$T_{RO}$=1250 ps→COUNT=66666.66/1250≈53±1;

$$CTRL = \frac{28 * COUNT * 26 * 21}{216} = \frac{COUNT}{21} = \frac{53}{2} \approx 26 \pm 1$$

In certain embodiments, the analytical example illustrates that "CTRL" corresponds to the midpoint of the eye margin waveform 600A in which the data signal represented by the eye margin waveform 600A is sampled may include a sampling period of the data signal. In one embodiment, the sampling period of the data signal represented by the eye margin waveform 600A may include approximately one-half of the unit interval (e.g., 0.5*UI).

Figure 7:
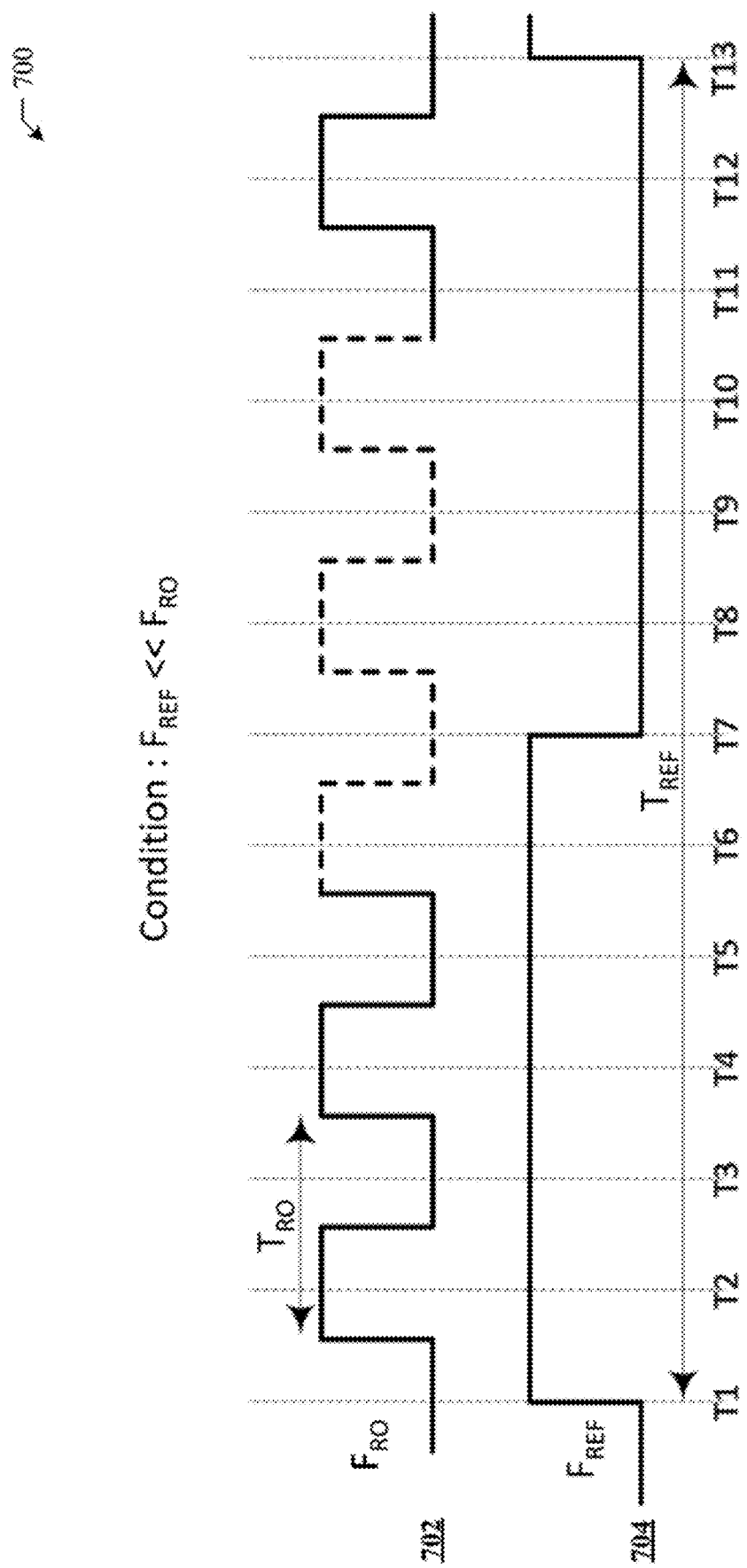
FIG. 7 illustrates timing diagrams for providing accurate clock calibration for an MCP electronic device over PVT corners.

FIG. 7 illustrates timing diagrams 700A (e.g., "$F_{RO}$") and 700B (e.g., "$F_{REF}$") for providing accurate clock calibration for the MCP electronic device 200 over PVT corners, in accordance with the presently disclosed embodiments. For example, referring back to FIGS. 6A and 6B above, the timing diagrams 700A (e.g., "$F_{RO}$") and 700B (e.g., "$F_{REF}$") illustrate the variation in frequencies of "$F_{RO}$" and "$F_{REF}$") over a time period "T1" to "T13." In certain embodiments, for proper operation, frequency of Fref<<Fro. This will help to improve the accuracy of the calibration.

Figure 8:
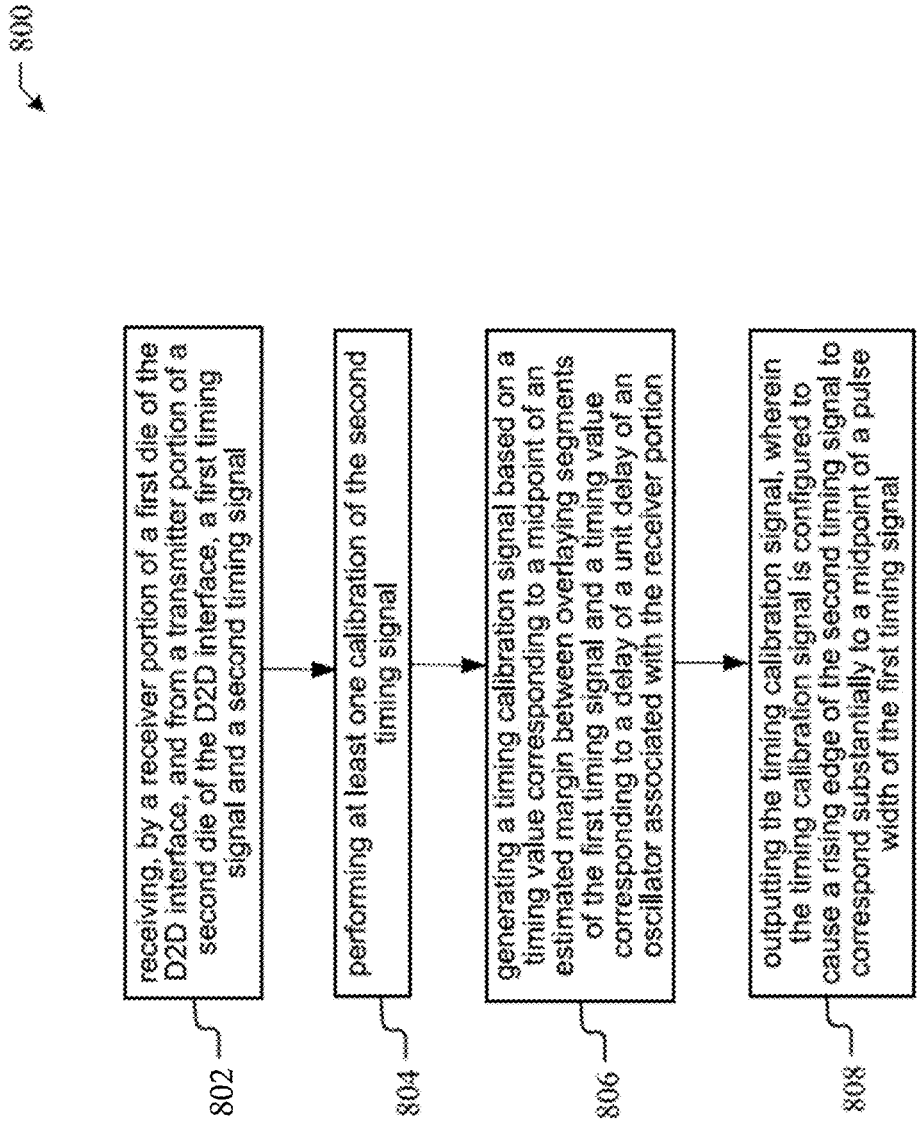
FIG. 8 is a flow diagram of a method for providing accurate clock calibration for an MCP electronic device over process, voltage, temperature (PVT) corners.

FIG. 8 illustrates is a flow diagram of a method 800 for providing accurate clock calibration for a multi-chip package (MCP) electronic device over process, voltage, temperature (PVT) corners, in accordance with the presently disclosed embodiments. The method 800 may be performed utilizing one or more processors (e.g., MCP electronic device 200) that may include hardware (e.g., a general purpose processor, a graphic processing units (GPU), an application-specific integrated circuit (ASIC), a system-on-chip (SoC), a microcontroller, a field-programmable gate array (FPGA), or any other processing device(s) that may be suitable for processing image data), software (e.g., instructions running/executing on one or more processors), firmware (e.g., microcode), or any combination thereof.

The method 800 may begin at block 802 with one or more processors (e.g., MCP electronic device 200) receiving, by a receiver portion of a first die of the D2D interface, and from a transmitter portion of a second die of the D2D interface, a first timing signal and a second timing signal. For example, in one embodiment, the first timing signal may include a data signal and the second timing signal may include a clock signal. The method 800 may then continue at block 804 with the one or more processors (e.g., MCP electronic device 200) performing at least one calibration of the second timing signal. The method 800 may then continue at block 806 with the one or more processors (e.g., MCP electronic device 200) performing at least one calibration of the second timing signal.

The method 800 may then continue at block 806 with the one or more processors (e.g., MCP electronic device 200) generating a timing calibration signal based on a timing value corresponding to a midpoint of an estimated margin between overlaying segments of the first timing signal and a timing value corresponding to a delay of a unit delay of an oscillator associated with the receiver portion. For example, in some embodiments, the timing value corresponding to the midpoint of the estimated margin may include a timing value corresponding to a midpoint of an eye margin of a data signal supplied from the transmitter portion of the second die to the receiver portion of the first die. In one embodiment, the timing value corresponding to the midpoint of the eye margin of the data signal may include a sampling period of the data signal. In one embodiment, the sampling period of the data signal may include approximately one-half of a unit interval corresponding to the eye margin of the data signal. The method 800 may then continue at block 808 with the one or more processors (e.g., MCP electronic device 200) outputting the timing calibration signal. In certain embodiments, the timing calibration signal may be configured to cause a rising edge of the second timing signal to correspond substantially to a midpoint of a pulse width of the first timing signal.

Figure 9:
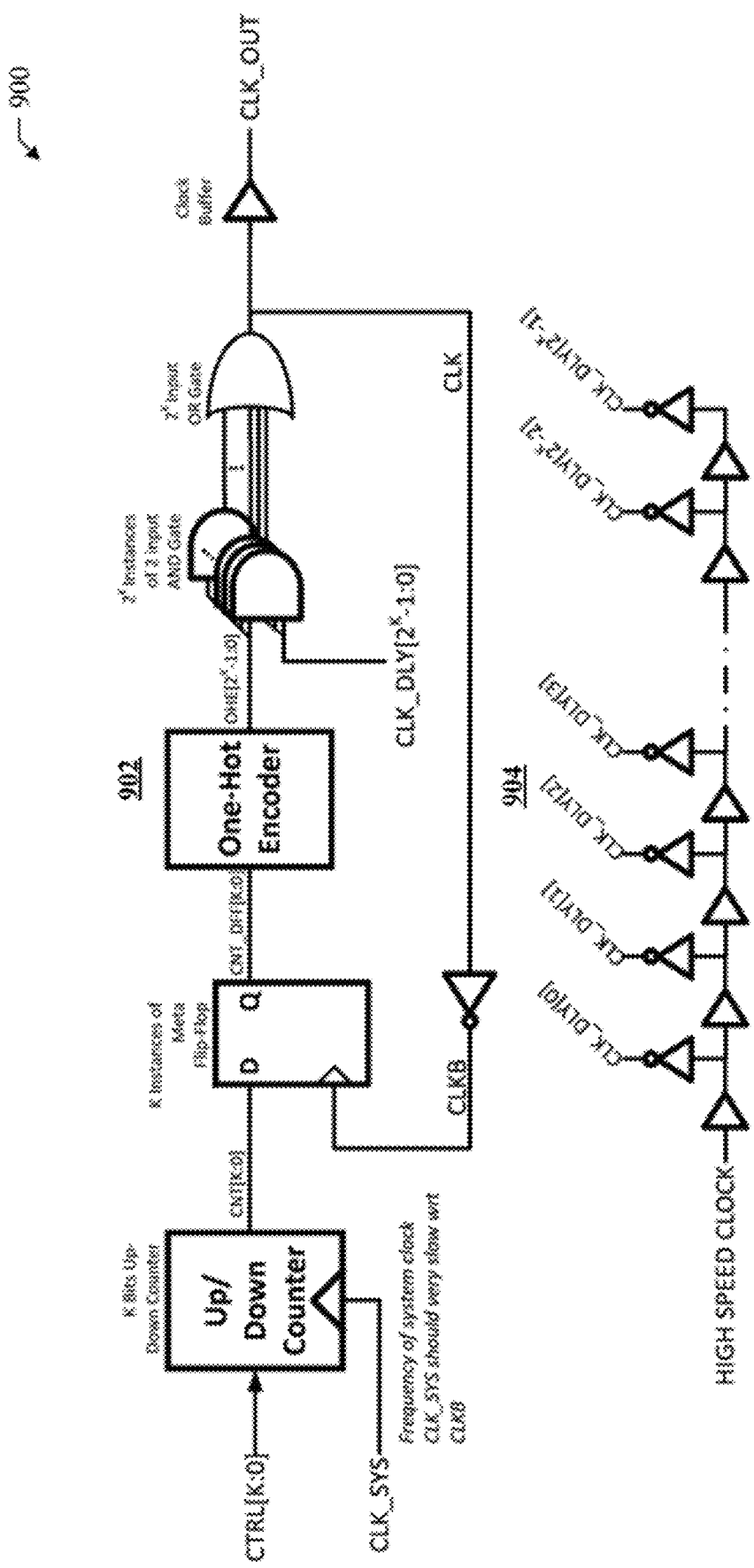
FIG. 9 illustrates a diagram one or more glitch power reduction architectures for reducing glitch power for the D2D interface.

High-Speed Multiplexer for Reducing Glitch Power for Die-to-Die (D2D) Interfaces FIG. 9 illustrates a diagram 900 one or more glitch power reduction architectures 902, 904 for reducing glitch power for the D2D interface, in accordance with the presently disclosed embodiments. As depicted, the one or more glitch power reduction architectures 902, 904 may include a combinational circuit architecture 902 and a delay line architecture 904 (e.g., high-speed multiplexer (MUX)). In certain embodiments, the combinational circuit architecture 902 and the delay line architecture 904 (e.g., high-speed MUX) may operate in conjunction in accordance with timing diagrams 1000 of FIG. 10 to reduce glitch power for D2D interfaces, in accordance with the presently disclosed embodiments.

Figure 10:
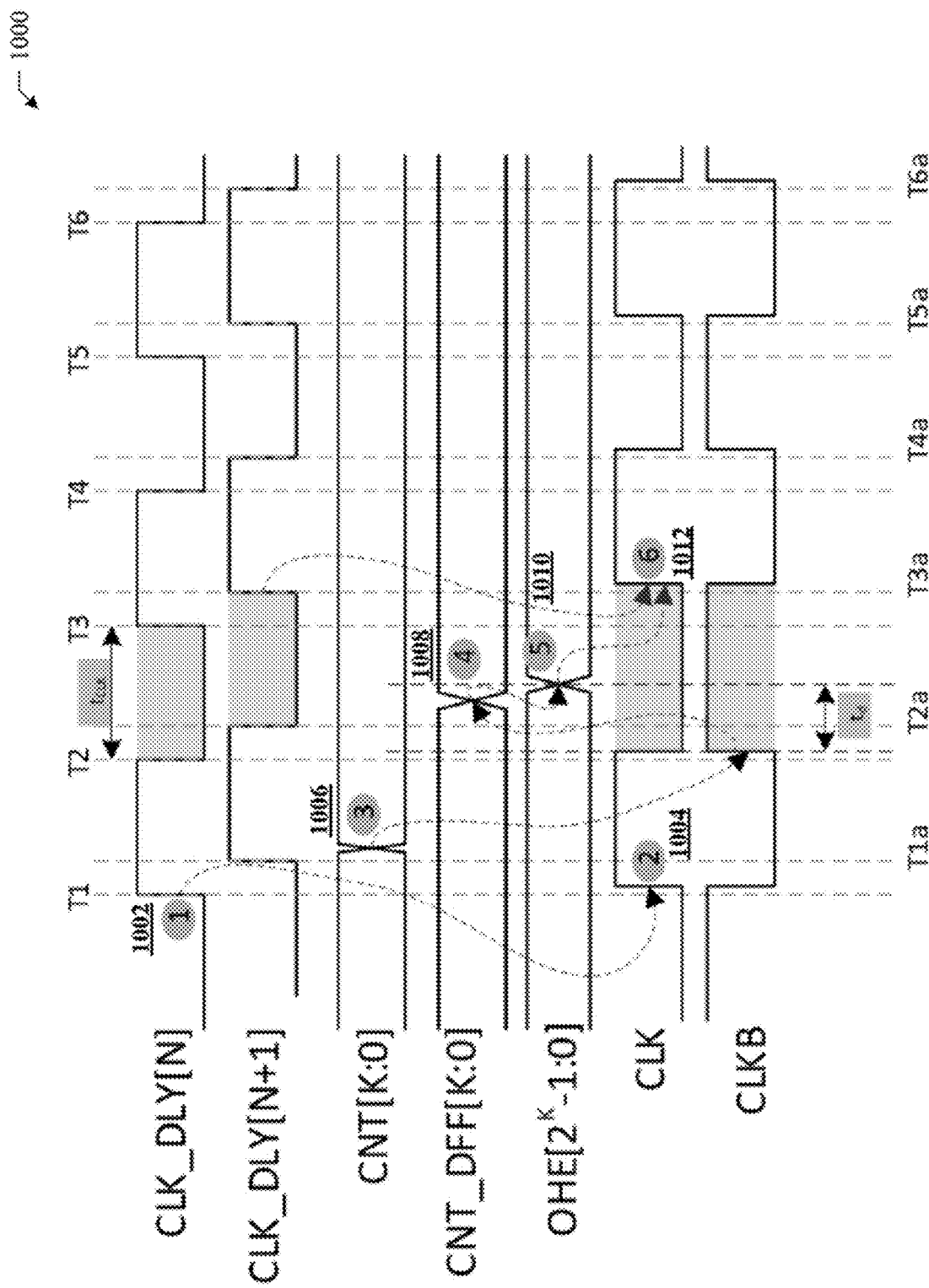
FIG. 10 illustrates timing diagrams for reducing glitch power for D2D interfaces.

FIG. 10 illustrates timing diagrams 1000 for reducing glitch power for D2D interfaces, in accordance with the presently disclosed embodiments. In certain embodiments, the timing diagrams 1000 of FIG. 10 may correspond to the one or more glitch power reduction architectures 902, 904 and may logically proceed in accordance with the following. For example, in certain embodiments, CLK_DLY[N] (e.g., as indicated by reference character 1002) and CLK_DLY[N+1] (e.g., as indicated by reference character 1012) may include high speed clock signals with small delay of (T1a-T1) seconds between them. These two clock signals may be any adjacent clock signals in CLK_DLY[$2^K$-1:0] (e.g., as indicated by reference character 1010). In one embodiment, CNT[K:0] (e.g., as indicated by reference character 1006) may be the output of Up/Down Counter. In some embodiments, the output of the Up/Down Counter is asynchronous when compared to CLK/CLKB clock signals, since CLK_SYS is a lower frequency system clock (e.g., CLK_SYS≤CLK/3).

In certain embodiments, a small delay may be included between CLK_DLY[N] and CLK due to a delay introduced by the AND and/or OR logic gates. In some embodiments, asynchronous control input CNT[K:0] (e.g., as indicated by reference character 1006)) is sampled by the meta flip-flop on the rising edge of CLKB and it appears at flip-flop output CNT_DFF[K:0] after some clock-to-q delay (e.g., as indicated by reference character 1008). In certain embodiments, One-Hot encoder block converts the binary code CNT_DFF[K:0] into a one-hot code so that only one of the $2^K$ AND gates may be enabled and one of delayed clocks CLK_DLY[$2^K$-1:0] is sent to $2^K$ input OR gate. In certain embodiments, the glitch in CLK may be preclude by performing the clock switching operation when the CLK_DLY[N] is logic-0. Thus, in accordance with the presently disclosed embodiments, $t_{clk} > t_d + t_{AND} + t_{OR}$.

Figure 11:
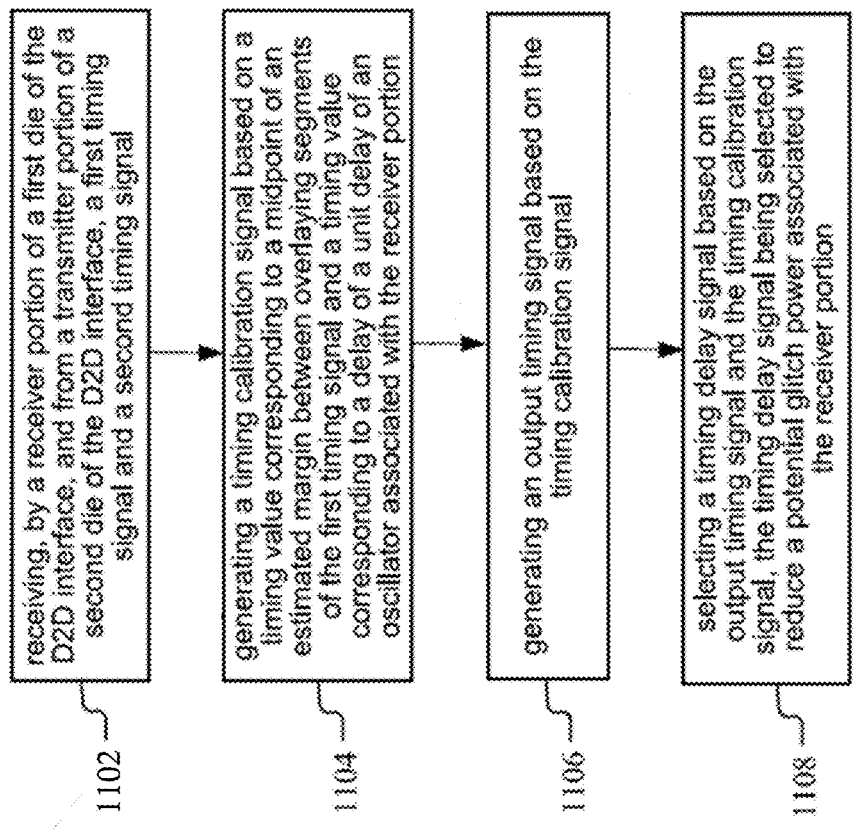
FIG. 11 is a flow diagram of a method for providing an MCP electronic device including a D2D interface and a high-speed multiplexer for reducing glitch power for the D2D interface.

FIG. 11 illustrates is a flow diagram of a method 1100 for providing a multi-chip package (MCP) electronic device including a die-to-die (D2D) interface and a high-speed multiplexer for reducing glitch power for the D2D interface, in accordance with the presently disclosed embodiments. The method 1100 may be performed utilizing one or more processors (e.g., MCP electronic device 200) that may include hardware (e.g., a general purpose processor, a graphic processing units (GPU), an application-specific integrated circuit (ASIC), a system-on-chip (SoC), a microcontroller, a field-programmable gate array (FPGA), or any other processing device(s) that may be suitable for processing image data), software (e.g., instructions running/executing on one or more processors), firmware (e.g., microcode), or any combination thereof.

The method 1100 may begin at block 1102 with one or more processors (e.g., MCP electronic device 200) receiving, by a receiver portion of a first die of the D2D interface, and from a transmitter portion of a second die of the D2D interface, a first timing signal and a second timing signal. For example, in one embodiment, the first timing signal may include a data signal and the second timing signal may include a clock signal. The method 1100 may then continue at block 1104 with the one or more processors (e.g., MCP electronic device 200) generating a timing calibration signal based on a timing value corresponding substantially to a midpoint of an estimated margin between overlaying segments of the first timing signal and a timing value corresponding to a delay of a unit delay associated with the receiver portion. For example, in some embodiments, the timing value corresponding to the midpoint of the estimated margin may include a timing value corresponding to a midpoint of an eye margin of a data signal supplied from the transmitter portion of the second die to the receiver portion of the first die.

The method 1100 may then continue at block 1106 with the one or more processors (e.g., MCP electronic device 200) generating an output timing signal based on the timing calibration signal and select a timing delay signal based on the output timing signal and the timing calibration signal. For example, in some embodiments, the timing delay signal may be selected to reduce a potential glitch power associated with the receiver portion. The method 1100 may then continue at block 1108 with the one or more processors (e.g., MCP electronic device 200) selecting the timing delay signal may by selecting at least one of a plurality of timing delay signals based on the output timing signal and the timing calibration signal. In certain embodiments, selecting the timing delay signal may further include receiving a feedback clock signal corresponding to the output timing signal, selecting a timing delay signal based on the feedback clock signal, and adjusting the output timing signal based on the selected timing delay signal. In one embodiment, the timing delay signal may be generated by a high-speed multiplexer configured to reduce the potential glitch power associated with the receiver portion.

System Overview

Figure 12:
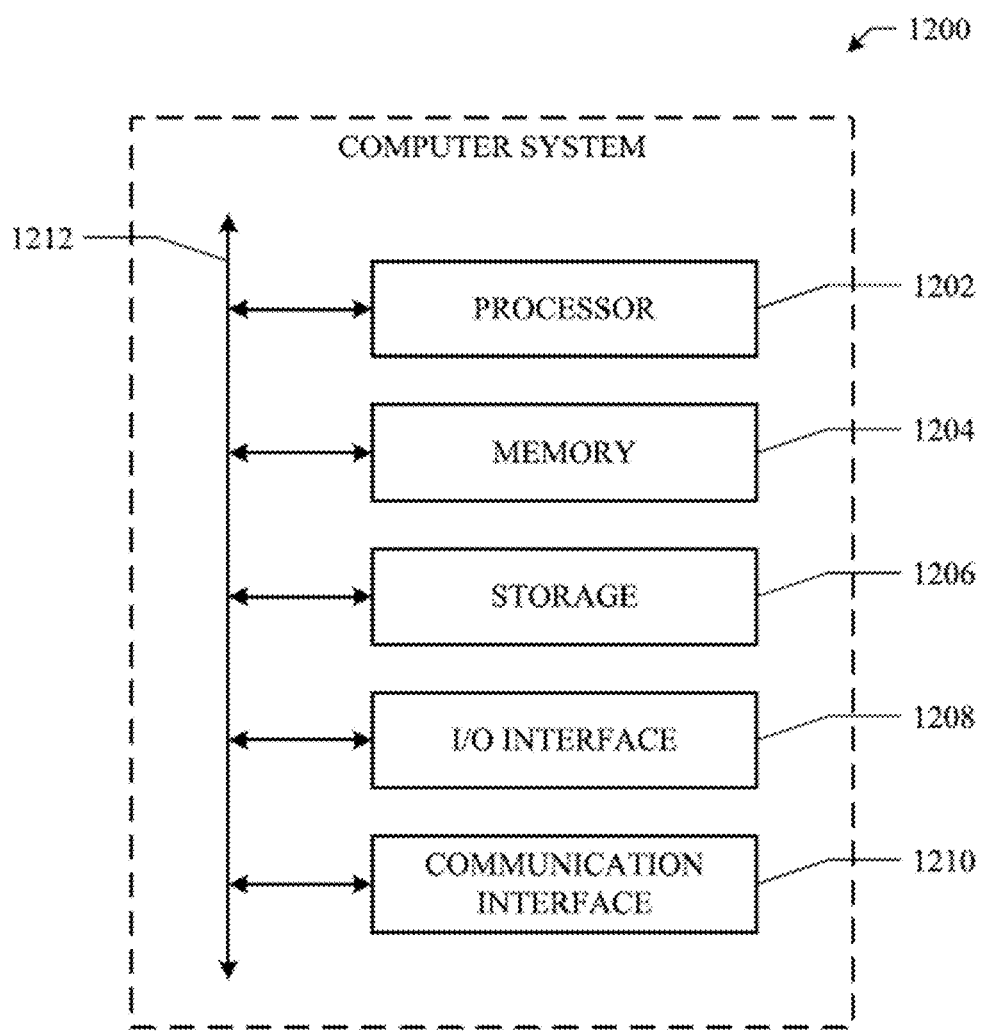
FIG. 12 illustrates an example computer system.

FIG. 12 illustrates an example computer system 1200 that may be useful in performing one or more of the foregoing techniques as presently disclosed herein. In certain embodiments, one or more computer systems 1200 perform one or more steps of one or more methods described or illustrated herein. In certain embodiments, one or more computer systems 1200 provide functionality described or illustrated herein. In certain embodiments, software running on one or more computer systems 1200 performs one or more steps of one or more methods described or illustrated herein or provides functionality described or illustrated herein. Certain embodiments include one or more portions of one or more computer systems 1200. Herein, reference to a computer system may encompass a computing device, and vice versa, where appropriate. Moreover, reference to a computer system may encompass one or more computer systems, where appropriate.

This disclosure contemplates any suitable number of computer systems 1200. This disclosure contemplates computer system 1200 taking any suitable physical form. As example and not by way of limitation, computer system 1200 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 1200 may include one or more computer systems 1200; be unitary or distributed; span multiple locations; span multiple machines; span multiple data centers; or reside in a cloud, which may include one or more cloud components in one or more networks. Where appropriate, one or more computer systems 1200 may perform without substantial spatial or temporal limitation one or more steps of one or more methods described or illustrated herein.

As an example, and not by way of limitation, one or more computer systems 1200 may perform in real time or in batch mode one or more steps of one or more methods described or illustrated herein. One or more computer systems 1200 may perform at different times or at different locations one or more steps of one or more methods described or illustrated herein, where appropriate. In certain embodiments, computer system 1200 includes a processor 1202, memory 1204, storage 1206, an input/output (I/O) interface 1208, a communication interface 1210, and a bus 1212. Although this disclosure describes and illustrates a particular computer system having a particular number of particular components in a particular arrangement, this disclosure contemplates any suitable computer system having any suitable number of any suitable components in any suitable arrangement.

In certain embodiments, processor 1202 includes hardware for executing instructions, such as those making up a computer program. As an example, and not by way of limitation, to execute instructions, processor 1202 may retrieve (or fetch) the instructions from an internal register, an internal cache, memory 1204, or storage 1206; decode and execute them; and then write one or more results to an internal register, an internal cache, memory 1204, or storage 1206. In certain embodiments, processor 1202 may include one or more internal caches for data, instructions, or addresses. This disclosure contemplates processor 1202 including any suitable number of any suitable internal caches, where appropriate. As an example, and not by way of limitation, processor 1202 may include one or more instruction caches, one or more data caches, and one or more translation lookaside buffers (TLBs). Instructions in the instruction caches may be copies of instructions in memory 1204 or storage 1206, and the instruction caches may speed up retrieval of those instructions by processor 1202.

Data in the data caches may be copies of data in memory 1204 or storage 1206 for instructions executing at processor 1202 to operate on; the results of previous instructions executed at processor 1202 for access by subsequent instructions executing at processor 1202 or for writing to memory 1204 or storage 1206; or other suitable data. The data caches may speed up read or write operations by processor 1202. The TLBs may speed up virtual-address translation for processor 1202. In certain embodiments, processor 1202 may include one or more internal registers for data, instructions, or addresses. This disclosure contemplates processor 1202 including any suitable number of any suitable internal registers, where appropriate. Where appropriate, processor 1202 may include one or more arithmetic logic units (ALUs); be a multi-core processor; or include one or more processors 602. Although this disclosure describes and illustrates a particular processor, this disclosure contemplates any suitable processor.

In certain embodiments, memory 1204 includes main memory for storing instructions for processor 1202 to execute or data for processor 1202 to operate on. As an example, and not by way of limitation, computer system 1200 may load instructions from storage 1206 or another source (such as, for example, another computer system 1200) to memory 1204. Processor 1202 may then load the instructions from memory 1204 to an internal register or internal cache. To execute the instructions, processor 1202 may retrieve the instructions from the internal register or internal cache and decode them. During or after execution of the instructions, processor 1202 may write one or more results (which may be intermediate or final results) to the internal register or internal cache. Processor 1202 may then write one or more of those results to memory 1204. In certain embodiments, processor 1202 executes only instructions in one or more internal registers or internal caches or in memory 1204 (as opposed to storage 1206 or elsewhere) and operates only on data in one or more internal registers or internal caches or in memory 1204 (as opposed to storage 1206 or elsewhere).

One or more memory buses (which may each include an address bus and a data bus) may couple processor 1202 to memory 1204. Bus 1212 may include one or more memory buses, as described below. In certain embodiments, one or more memory management units (MMUs) reside between processor 1202 and memory 1204 and facilitate accesses to memory 1204 requested by processor 1202. In certain embodiments, memory 1204 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1204 may include one or more memories 1204, where appropriate. Although this disclosure describes and illustrates particular memory, this disclosure contemplates any suitable memory.

In certain embodiments, storage 1206 includes mass storage for data or instructions. As an example, and not by way of limitation, storage 1206 may include a hard disk drive (HDD), a floppy disk drive, flash memory, an optical disc, a magneto-optical disc, magnetic tape, or a Universal Serial Bus (USB) drive or a combination of two or more of these. Storage 1206 may include removable or non-removable (or fixed) media, where appropriate. Storage 1206 may be internal or external to computer system 1200, where appropriate. In certain embodiments, storage 1206 is non-volatile, solid-state memory. In certain embodiments, storage 1206 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1206 taking any suitable physical form. Storage 1206 may include one or more storage control units facilitating communication between processor 1202 and storage 1206, where appropriate. Where appropriate, storage 1206 may include one or more storages 1206. Although this disclosure describes and illustrates particular storage, this disclosure contemplates any suitable storage.

In certain embodiments, I/O interface 1208 includes hardware, software, or both, providing one or more interfaces for communication between computer system 1200 and one or more I/O devices. Computer system 1200 may include one or more of these I/O devices, where appropriate. One or more of these I/O devices may enable communication between a person and computer system 1200. As an example, and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1208 for them. Where appropriate, I/O interface 1208 may include one or more device or software drivers enabling processor 1202 to drive one or more of these I/O devices. I/O interface 1208 may include one or more I/O interfaces 1208, where appropriate. Although this disclosure describes and illustrates a particular I/O interface, this disclosure contemplates any suitable I/O interface.

In certain embodiments, communication interface 1210 includes hardware, software, or both providing one or more interfaces for communication (such as, for example, packet-based communication) between computer system 1200 and one or more other computer systems 1200 or one or more networks. As an example, and not by way of limitation, communication interface 1210 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1210 for it.

As an example, and not by way of limitation, computer system 1200 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1200 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1200 may include any suitable communication interface 1210 for any of these networks, where appropriate. Communication interface 1210 may include one or more communication interfaces 1210, where appropriate. Although this disclosure describes and illustrates a particular communication interface, this disclosure contemplates any suitable communication interface.

In certain embodiments, bus 1212 includes hardware, software, or both coupling components of computer system 1200 to each other. As an example and not by way of limitation, bus 1212 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1212 may include one or more buses 1212, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates certain embodiments as providing particular advantages, certain embodiments may provide none, some, or all of these advantages.

What is claimed is:

1. A method implemented by a multi-chip package (MCP) electronic device including a die-to-die (D2D) interface, the method comprising:
receiving, by a receiver portion of a first die of the D2D interface, and from a transmitter portion of a second die of the D2D interface, a first timing signal and a second timing signal;
generating a timing calibration signal based on a timing value corresponding substantially to a midpoint of an estimated margin between overlaying segments of the first timing signal and a timing value corresponding to a delay of a unit delay associated with the receiver portion;
generating an output timing signal based on the timing calibration signal; and
selecting a timing delay signal based on the output timing signal and the timing calibration signal, the timing delay signal being selected to reduce a potential glitch power associated with the receiver portion.

2. The method of claim 1, wherein the first timing signal comprises a data signal, and wherein the second timing signal comprises a clock signal.

3. The method of claim 1, wherein the timing value corresponding to the midpoint of the estimated margin comprises a timing value corresponding to a midpoint of an eye margin of a data signal supplied from the transmitter portion of the second die to the receiver portion of the first die.

4. The method of claim 1, wherein selecting the timing delay signal comprises selecting at least one of a plurality of timing delay signals based on the output timing signal and the timing calibration signal.

5. The method of claim 1, wherein selecting the timing delay signal further comprises:
receiving a feedback clock signal corresponding to the output timing signal;
selecting a timing delay signal based on the feedback clock signal; and
adjusting the output timing signal based on the selected timing delay signal.

6. The method of claim 1, wherein the timing value corresponding to the delay of the unit delay associated with the receiver portion comprises a timing value corresponding to a delay of a unit delay buffer of a ring oscillator of the receiver portion.

7. The method of claim 1, wherein the timing delay signal is generated by a high-speed multiplexer configured to reduce the potential glitch power associated with the receiver portion.

8. An electronic device including a die-to-die (D2D) interface, comprising:
one or more non-transitory computer-readable storage media including instructions; and
one or more processors coupled to the storage media, the one or more processors configured to execute the instructions to:
receive, by a receiver portion of a first die of the D2D interface, and from a transmitter portion of a second die of the D2D interface, a first timing signal and a second timing signal;
generate a timing calibration signal based on a timing value corresponding substantially to a midpoint of an estimated margin between overlaying segments of the first timing signal and a timing value corresponding to a delay of a unit delay associated with the receiver portion;
generate an output timing signal based on the timing calibration signal; and
select one or more timing delay signals based at least in part on the output timing signal and the timing calibration signal, the one or more timing delay signals being selected to reduce a potential glitch power associated with the receiver portion.

9. The electronic device of claim 8, wherein the first timing signal comprises a data signal, and wherein the second timing signal comprises a clock signal.

10. The electronic device of claim 8, wherein the timing value corresponding to the midpoint of the estimated margin comprises a timing value corresponding to a midpoint of an eye margin of a data signal supplied from the transmitter portion of the second die to the receiver portion of the first die.

11. The electronic device of claim 8, wherein the instructions to select the timing delay signal further comprise instructions to select at least one of a plurality of timing delay signals based on the output timing signal and the timing calibration signal.

12. The electronic device of claim 8, wherein selecting the timing delay signal further comprise instructions to:
receive a feedback clock signal corresponding to the output timing signal;
select a timing delay signal based on the feedback clock signal; and
adjust the output timing signal based on the selected timing delay signal.

13. The electronic device of claim 8, wherein the timing value corresponding to the delay of the unit delay associated with the receiver portion comprises a timing value corresponding to a delay of a unit delay buffer of a ring oscillator of the receiver portion.

14. The electronic device of claim 8, wherein the timing delay signal is generated by a high-speed multiplexer configured to reduce the potential glitch power associated with the receiver portion.

15. A non-transitory computer-readable medium comprising instructions that, when executed by one or more processors of an electronic device including a die-to-die (D2D) interface, cause the one or more processors to:
receive, by a receiver portion of a first die of the D2D interface, and from a transmitter portion of a second die of the D2D interface, a first timing signal and a second timing signal;
generate a timing calibration signal based on a timing value corresponding substantially to a midpoint of an estimated margin between overlaying segments of the first timing signal and a timing value corresponding to a delay of a unit delay associated with the receiver portion;
generate an output timing signal based on the timing calibration signal; and select one or more timing delay signals based at least in part on the output timing signal and the timing calibration signal, the one or more timing delay signals being selected to reduce a potential glitch power associated with the receiver portion.

16. The non-transitory computer-readable medium of claim 15, wherein the first timing signal comprises a data signal, and wherein the second timing signal comprises a clock signal.

17. The non-transitory computer-readable medium of claim 15, wherein the timing value corresponding to the midpoint of the estimated margin comprises a timing value corresponding to a midpoint of an eye margin of a data signal supplied from the transmitter portion of the second die to the receiver portion of the first die.

18. The non-transitory computer-readable medium of claim 15, wherein the instructions to select the timing delay signal further comprise instructions to select at least one of a plurality of timing delay signals based on the output timing signal and the timing calibration signal.

19. The non-transitory computer-readable medium of claim 15, wherein selecting the timing delay signal further comprise instructions to:
    receive a feedback clock signal corresponding to the output timing signal;
    select a timing delay signal based on the feedback clock signal; and
    adjust the output timing signal based on the selected timing delay signal.

20. The non-transitory computer-readable medium of claim 15, wherein the timing value corresponding to the delay of the unit delay associated with the receiver portion comprises a timing value corresponding to a delay of a unit delay buffer of a ring oscillator of the receiver portion.

* * * * *